Nov. 10, 1970 D. F. SHEAHAN 3,539,943

OSCILLATOR UTILIZING GYRATOR CIRCUIT

Filed March 7, 1969 3 Sheets-Sheet 1

INVENTOR.
DESMOND F. SHEAHAN
BY
Spencer E. Olson
ATTY.

Nov. 10, 1970 D. F. SHEAHAN 3,539,943

OSCILLATOR UTILIZING GYRATOR CIRCUIT

Filed March 7, 1969 3 Sheets-Sheet 3

United States Patent Office 3,539,943

Patented Nov. 10, 1970

3,539,943
OSCILLATOR UTILIZING GYRATOR CIRCUIT

Desmond F. Sheahan, San Carlos, Calif., assignor to Automatic Electric Laboratories, Inc., Northlake, Ill., a corporation of Delaware Filed Mar. 7, 1969, Ser. No. 805,240
Int. Cl. H03b 5/00
U.S. Cl. 331—108 4 Claims

ABSTRACT OF THE DISCLOSURE

A stable RC oscillator, utilizing a gyrator circuit including amplifiers and requiring no matched components, can be tuned by varying the value of a single resistor or capacitor, and its frequency stability is limited only by the stability of the RC products used in its implementation.

BACKGROUND OF THE INVENTION

This invention relates generally to oscillators of the RC type, and more particularly to oscillators having a high degree of frequency stability, a minimum of components, and a configuration which is readily integrable.

For applications requiring a high degree of frequency stability, ease of tuning, low cost and minimum size, known RC oscillators have shortcomings which limit their acceptability. For example, the Wien Bridge oscillator, one of the most common RC oscillators in use today, utilizes one amplifier, two capacitors and four resistors. The oscillation frequency is determined by an RC product and is stable, but two components must be adjusted to effect tuning, one for frequency adjustment and the other to adjust the damping.

Another popular oscillator, the twin-T, one example of which is described on pages 319–323 of Bell Laboratories Record, October-November 1966, employs one amplifier, three resistors and three capacitors, one more capacitor than the minimum needed. Because of this redundancy, matched components are required thereby making the frequency sensitive to slight mismatches in the components.

Another known type of RC oscillator is the circuit described in the articles by E. F. Good appearing in Electronic Engineering, April 1957, pages 164–169 and May 1957, pages 210–213. This circuit contains three amplifiers, four resistors and two capacitors, does not require matched components, and can be tuned by varying any one of its resistors or capacitors. The oscillator is very stable, but has the disadvantage of requiring three amplifiers, which obviously contributes to its cost.

It is the principal object of the present invention to provide an RC oscillator requiring only two ampilfiers, a minimum of resistors and capacitors, no matched components, which is tunable by adjustment of only one of its capacitors or resistors, and having a high degree of frequency stability with respect to variations in temperature or supply voltage.

SUMMARY OF THE INVENTION

Briefly, the foregoing object is realized by combining a gyrator circuit of the Riordan type—which contains two readily integrable amplifiers and four resistors—with a capacitor to simulate an inductor, and connecting an additional capacitor across the terminals of the simulated inductor to form a resonant LC circuit. By reducing the dissipation of the simulated resonant circuit to a value equal to or less than zero the circuit oscillates at a frequency determined by the LC product. The frequency can be tuned by varying any one of the four resistors or either of the two capacitors, and the frequency stability is limited only by the stability of RC products.

DESCRIPTION OF THE DRAWINGS

The nature of the invention and a better understanding of its operation will be had from the following detailed description taken in conjunction with the accompanying drawings, in which.

PRINCIPLE OF OPERATION

Figures 1, 1A, 2:
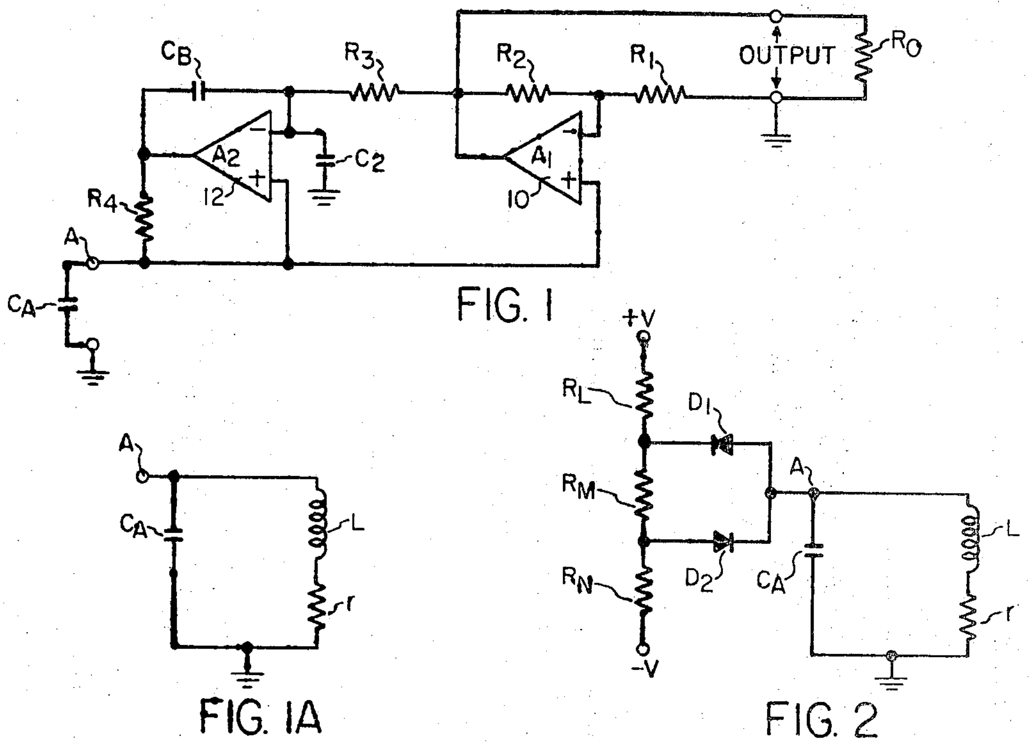
FIG. 1 is a circuit diagram, partially in block diagram form, of an oscillator according to the invention.
FIG. 1A is a diagram of the effective resonant circuit of the oscillator of FIG. 1.
FIG. 2 is a circuit diagram illustrating a limiter connected to the resonant circuit of FIG. 1A.

The principle involved in this oscillator is to combine a gyrator circuit, containing primarily resistive elements, with a capacitor in a manner so as to simulate an inductor, across which, in turn, is connected another capacitor to form a resonant LC circuit. Known gyrator circuits, usually employing some form of non-reciprocal active device such as unidirectional amplifiers, have been implemented in various ways, and with the development of integrated circuits and other fabrication techniques, have become extremely small in size and use mainly solid state components. Of the several known forms of gyrators, the circuit described by R. H. S. Riordan in Electronics Letters, vol. 2, No. 2, February 1967, pages 50–51, is particularly adaptable for the implementation of the present oscillator circuit. Referring to FIG. 1, the Riordan gyrator generally comprises a pair of operational amplifiers 10 and 12, the positive input terminals of which are connected together and to a terminal A, one terminal of one of the two-terminal ports of the circuit. The negative input terminal of ampilfier 10 is connected through resistor $R_1$ to ground (the other terminal of the aforementioned port), and the output of ampilfier 10 is connected through resistor $R_2$ to the negative input of this amplifier. The output of amplifier 10 is also connected through resistor $R_3$ to the negative input terminal of amplifier 12, and the output of ampilfier 12 is connected through resistor $R_4$ to terminal A and to the positive inputs of both amplifiers. The four resistors, $R_1$, $R_2$, $R_3$ and $R_4$ fix the gyration resistance of the gyrator, and in accordance with Riordan's teaching, when a capacitor $C_B$ is connected across the port defined by the negative input terminal and the output terminal of amplifier 12, the port between terminal A and ground behaves as an inductor having an inductance value, $L=R_1R_3R_4C_B/R_2$, and is grounded. No cancellations of any kind are involved in the operation and, with perfect amplifiers, the quality of the simulated inductance depends simply upon the quality of the capacitor and the four resistors. In the practical case, however, this simulated inductance will have a small amount of dissipation. Thus, a practical simulated inductance from FIG. 1 has a small resistance $r$ in series with it as shown in FIG. 1A.

In accordance with the invention, the resonant circuit of the oscillator is formed by connecting a second capacitor $C_A$ between terminal A and ground to produce the LC resonant circuit shown in FIG. 1A. The dissipation of the resonant circuit, represented by $r$, is decreased by a capacitor $C_2$ connected between the negative input terminal of amplifier 12 and ground, to a value equal to or less than zero, thereby allowing the circuit to oscillate at a frequency determined by the LC product.

The expressions for the inductance and dissipation of the simulated inductance in FIG. 1 are:

$$L=C_B\frac{R_1R_3R_4}{R_2}\left[1+\epsilon_1\frac{(R_1+R_2)^2}{R_1R_2}-\epsilon_2\frac{(R_1-R_2)}{R_2}+\epsilon_2\frac{\omega}{\omega_2}\left(\frac{R_1}{R_2}\omega C_BR_3+\frac{1}{\omega C_BR_3}\right)\right] \quad (1)$$

$$D=\frac{r\omega}{L\omega}=\epsilon_2\left(\frac{R_1}{R_2}\omega C_BR_3+\frac{1}{\omega C_BR_3}\right)-\frac{R_1}{R_2}\omega C_2R_3-\epsilon_1\frac{\omega}{\omega_1}\frac{(R_1+R_2)^2}{R_1R_2}+\epsilon_2\frac{\omega}{\omega_2}\frac{(R_1-R_2)}{R_2} \quad (2)$$

where $$\epsilon_1=\frac{1}{A_1}$$

and $$\epsilon_2=\frac{1}{A_2}$$

and $A_1$ and $A_2$ are the low frequency gains of amplifiers 10 and 12, respectively, and $\omega_1$ and $\omega_2$ are their −3 db frequencies.

If only low frequencies are considered where:

$$\frac{\omega}{\omega_1}=\frac{\omega}{\omega_2}\simeq 0$$

and if two identical amplifiers are used so that $\epsilon_1=\epsilon_2=\epsilon$ the equations simplify to:

$$L=C_B\frac{R_1R_3R_4}{R_2}\left[1+\epsilon\left(3+\frac{R_2}{R_1}\right)\right] \quad (3)$$

which for $R_1=R_2$ becomes:

$$L=C_BR_3R_4[1+4\epsilon] \quad (4)$$

and the dissipation becomes:

$$D=\epsilon\left(\omega C_BR_3\frac{1}{\omega C_BR_3}\right)-\omega C_2R_3 \quad (5)$$

If it is now assumed that $C_B$ is chosen to be equal to $1/\omega R_3$, $\omega C_BR_3+1/\omega C_BR_3$, which is the basic dissipation term above, reduces to its minimum value of 2 and Equation 5 simplifies to:

$$D=2\epsilon-\frac{C_2}{C_B} \quad (6)$$

It can be seen from this equation that the dissipation is non-positive when $C_2$ is $\geqq 2\epsilon C_B$. This is, therefore, the condition required for oscillation.

An idea of the magnitudes of the factors involved in these equations will be evident if it is assumed that amplifiers have 60 db gain are used. This means that $\epsilon=10^{-3}$ and the minimum value of $C_2$ required for oscillation will be $C_B/500$.

Equation 4 indicates that the greater the gains of amplifiers 10 and 12 the more closely will the simulated inductance be equal to the ideal value of $L=C_BR_3R_4$, and for 60 db amplifiers the actual amount by which the inductance will differ from the ideal will be only 0.4%.

The oscillator is very stable since variations in the properties of the amplifiers due to changes in temperature or supply voltage have very little effect on the value of inductance inasmuch as such changes can affect the inductance only via the $\epsilon$ term in Equation 4. If, for example, it is assumed that the low frequency gains of the amplifiers change by 1 db over the range of operating conditions, this would cause a 0.04% change in L if 60 db amplifiers were used. However, a greater change would be experienced at frequencies comparable to the amplifier bandwidth.

If $\epsilon$ is assumed to be equal to zero, the frequency of oscillation of the circuit of FIG. 1 is given by:

$$f=\frac{1}{2\pi\sqrt{LC_A}}=\frac{1}{2\pi}\sqrt{\frac{R_2}{R_1R_3R_4C_AC_B}} \quad (7)$$

Thus, it is evident that the frequency can be tuned by varying any one of the four resistors $R_1$, $R_2$, $R_3$ or $R_4$, or either of the two capacitors, $C_A$ or $C_B$. A greater tuning range is obtainable, however, if two components, such as $C_A$ and $C_B$, are varied simultaneously.

If all resistors have the same temperature coefficient $TC_R$, and all capacitors have the same temperature coefficient $TC_C$, the temperature coefficient of the oscillator frequency $TC_F$ will be:

$$TC_F=-(TC_R+TC_C) \quad (8)$$

which means that the stability of the oscillator frequency is limited only by the stability of the RC products. This can be more clearly seen by simplifying Equation 7 a little further by letting $R_1=R_2=R_3=R_4=R$ and $C_A=C_B=C$. The frequency of oscillation is then simply:

$$f=\frac{1}{2\pi RC} \quad (9)$$

In common with other forms of oscillators, some method of limiting the output voltage of the oscillator is required. By reason of the nature of the oscillator, this can be done very simply by placing a diode limiter across the resonant circuit as shown in FIG. 2. The limiter circuit comprises a voltage divider consisting of resistors $R_L$, $R_M$ and $R_N$ connected in series across a suitable source of potential represented by +V and −V, and a pair of oppositely poled diodes D1 and D2 connected from terminal A to the junctions of resistors $R_L$ and $R_M$, and $R_M$ and $R_N$, respectively. The limiter operates by increasing the dissipation of the resonant circuit when the peak-to-peak voltage exceeds the value of:

$$V=2V\frac{R_M}{R_L+R_M+R_N}+2D \quad (10)$$

where 2V is the total power supply voltage and D is the voltage drop across one of the diodes, which typically is approximately 0.6 volt. With this limiter in the circuit a value of $C_2$ (FIG. 1) greater than the minimum value required by Equation 6 can be used so as to obtain a fast start-up for the oscillator.

The output of the oscillator is taken directly from the output of amplifier 10. Because of the feedback action of the two interconnected operational amplifiers the impedance at this point is very low with the consequence that a load resistor $R_0$ connected between the output terminal and ground will not disturb the oscillator frequency. For $R_1=R_2$ the output voltage will be twice that appearing across the resonant circuit, and when the limiter circuit is used, the output voltage from Equation 10 is:

$$V_{out}=2V_L=4V\frac{R_M}{R_L+R_M+R_N}+4D \quad (11)$$

DESCRIPTION OF PREFERRED EMBODIMENT

Having described the principle of operation, a specific implementation of the oscillator which has been constructed and successfully operated will now be described with reference to FIG. 3. This oscillator, which is by way of example only, was designed to have a nominal frequency of approximately 1500 Hz. and an output signal level of approximately 0.6 volt R.M.S., characteristics useful, for example, for generating tone signals for controlling the switching functions of a telephone central switching system. Integrated circuit amplifiers were used in the implementation of the circuit, they being shown within the dotted line enclosure; a Signetics NE510A integrated operational amplifier was used, but comparable circuits from other suppliers can, of course, be used. The heavy black dots at the perimeter of the enclosure designate connections from the amplifier elements on the chip to the other components of the circuit—discrete components in this example. The base of the input transistor of amplifier 12 is connected to the junction of capacitor $C_B$ and resistor $R_3$ and its collector is connected to a source of positive potential represented by terminal +V, and the base of the left-hand transistor is connected to terminal A and to the base of the righ-hand transistor of amplifier 10, thus corresponding to the schematic diagram of FIG. 1. Resistors $R_2$, $R_3$ and $R_4$ correspond to the similarly identified resistors in FIG. 1, and the value of $R_1$ is determined by the parallel combination of resistors $R_{1A}$ and $R_{1B}$ connected between the source of positive potential and ground. The amplifiers have 60 db of gain and the resistors were chosen to have equal resistances of 21.5 kilohms. The resistors were commercially available components with temperature coefficients of less than 100 p.p.m./° C. Capacitors $C_A$ and $C_B$ have equal capacitances of 4,990 picofarads and capacitor $C_2$ has a value of 300 picofarads. All capacitors were readily available mica components with temperature coefficients of 40 p.p.m./° C. Although the frequency of the oscillator can be tuned by varying any one of the resistors or capacitors, resistor $R_4$ is shown to be variable, for reasons which will appear in discussion to follow of the performance of the oscillator. The resistors of the circuit not previously specifically identified have the values indicated in the drawing.

Because of the low level output of this particular circuit, the output limiter differs from that shown in FIG. 2 in that two silicon diodes D1 and D2, without the voltage dividing resistors, are all that is required for the limiting function. However, a capacitor $C_3$ is connected between terminal A and the diodes to isolate the bias circuits of the gyrator from a path to ground through the diodes. Capacitor isolation was required in this circuit because of the contemplated large range of power supply voltage, but for expected smaller changes in supply voltage a circuit such as shown in FIG. 3, with $R_M$ equal to zero, would be used. In the present example, capacitor $C_3$ has a value of 5,000 picofarads.

Figure 3:
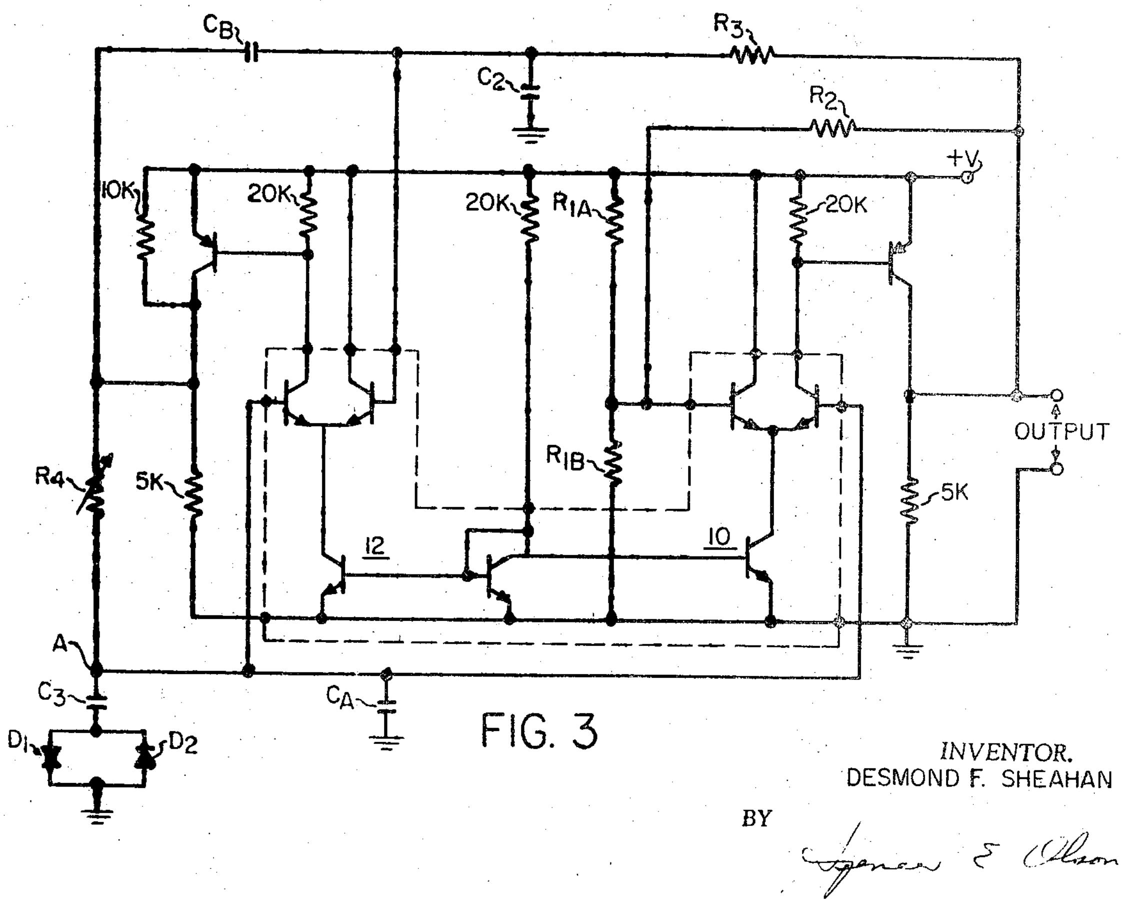
FIG. 3 is a circuit diagram of a specific embodiment of the present oscillator circuit.
Figure 4:
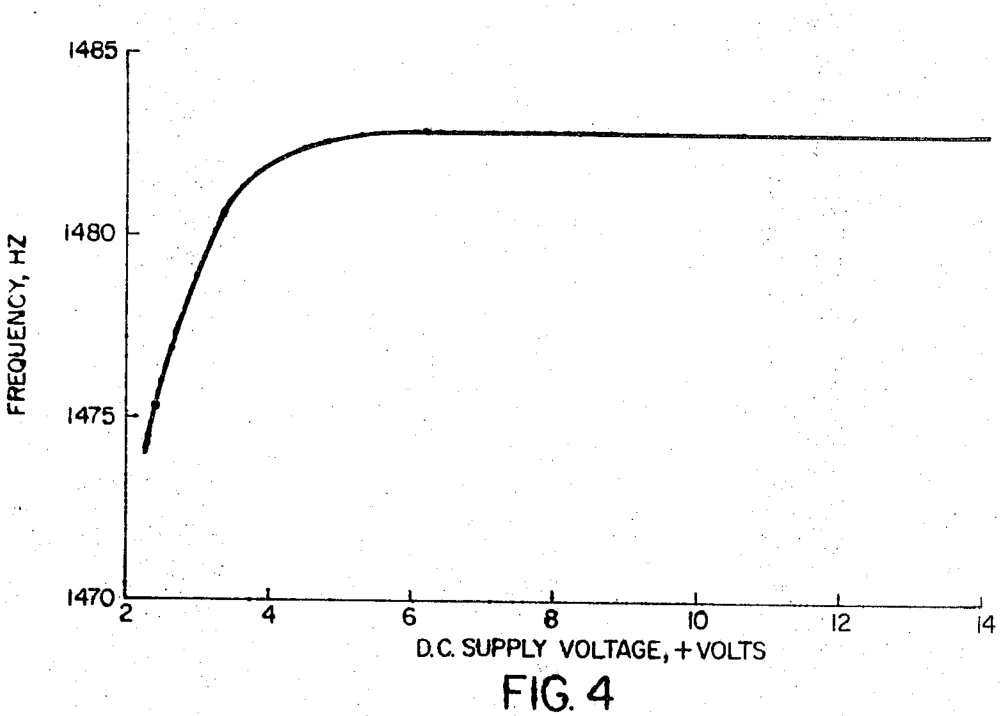
FIGS. 4 and 5 are curves respectively illustrating the changes in frequency and output level of the oscillator of FIG. 3 caused by variations in supply voltage.
Figure 5:
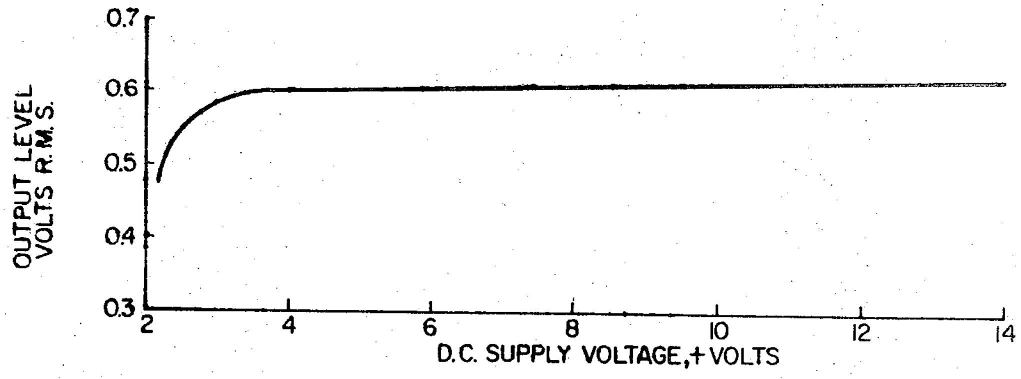

The changes in frequency and output level caused by variations of the D.C. supply voltage of the circuit of FIG. 3 are plotted in FIGS. 4 and 5, respectively. Oscillations were measured at a supply voltage of about 2.5 volts and the circuit gave a substantially constant output level over a range of supply voltage from 4 to 14 volts. As expected, at low values of supply voltage the frequency is dependent on supply voltage, but was substantially constant over the range from 4 to 14 volts.

Figure 6:
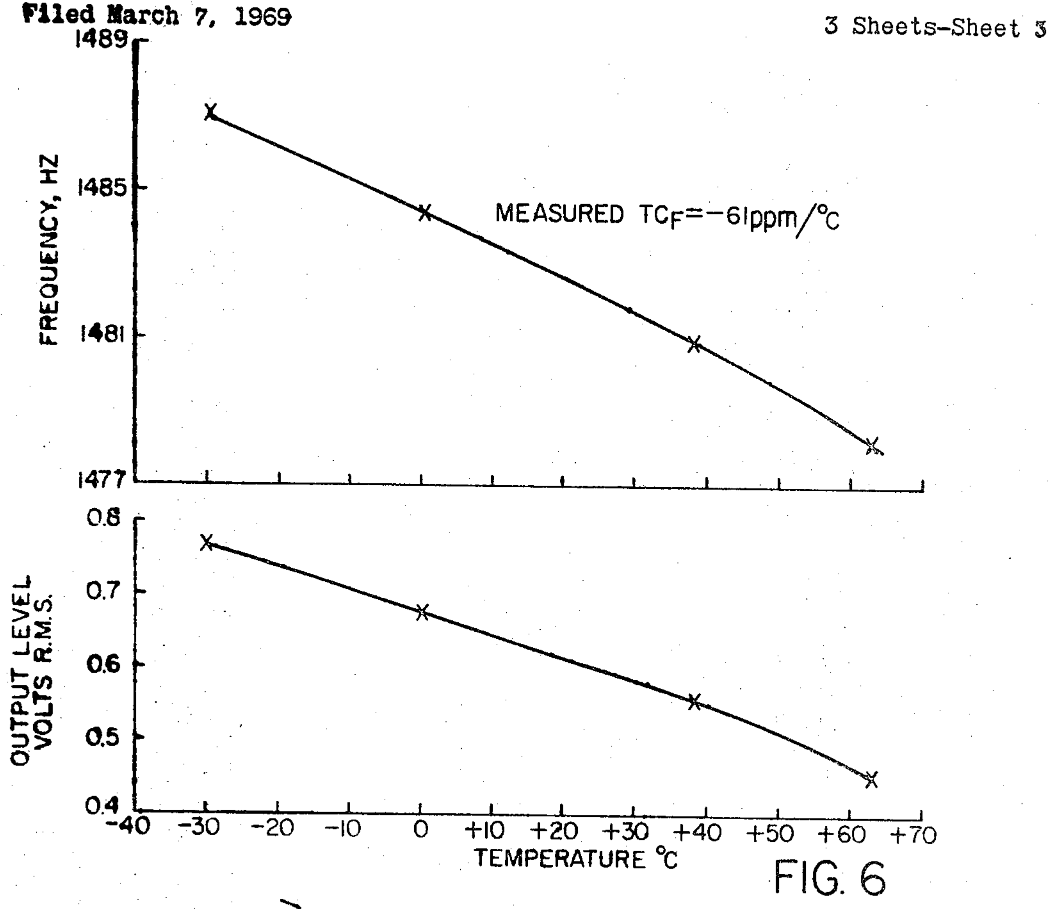
FIG. 6 are curves showing the performance of the oscillator of FIG. 3 over a range of operating temperatures.

FIG. 6 shows the performance of the oscillator for a supply voltage of six volts over the temperature range of −30° C. to +60° C. The measured value of $TC_F$ of −61 p.p.m./° C. was about as expected since $TC_C$ was +40 p.p.m./° C. and $TC_R$ for the metal film resistors used was less than 100 p.p.m./° C. The output level change of approximately 4 db over the temperature range −30° C. to +60° C. is caused by the temperature dependence of the zero current voltage of diodes D1 and D2 and was predicted.

Figure 7:
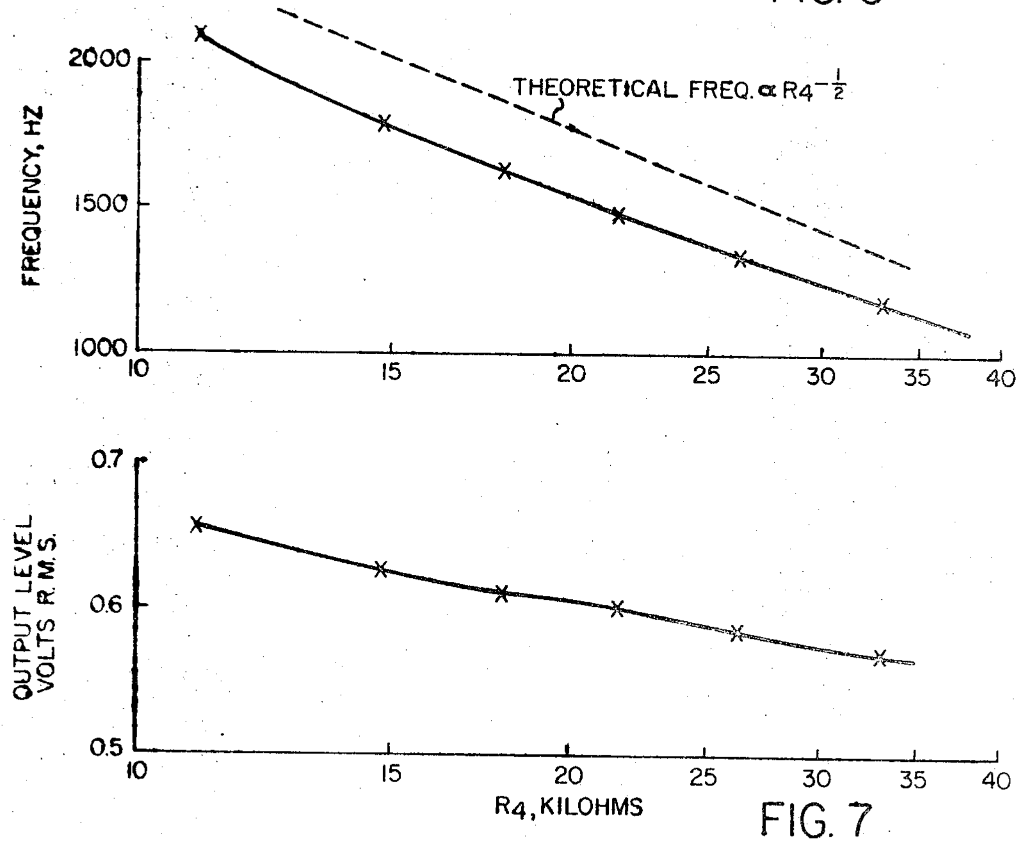
FIG. 7 is a semi-logarithmic plot of frequency and output level as a function of the value of one of the resistors in the circuit of FIG. 3.

FIG. 7 shows the variation of frequency and output level with changes in the value of resistor $R_4$ with a fixed value of supply voltage and an operating temperature of 25° C. This semi-logarithmic plot shows that the actual frequency variation closely approximates the ideal slope predicted by Equation 7. This plot also clearly shows the ease with which the oscillator can be tuned.

The total harmonic content in the output of the oscillator was approximately 40 db below the fundamental during all tests. The resistance of the oscillator as seen from the D.C. supply voltage was 3.0 kilohms.

Although only a low level oscillator has been specifically disclosed, essentially the same implementation, with the addition of Class B output stages, has been constructed which gave an output voltage of 7.5 volts peak-to-peak, and had comparable performance characteristics.

What is claimed is:

1. An oscillator circuit comprising, in combination:

a gyrator circuit including a pair of resistively interconnected operational amplifiers having at least first and second two-terminal ports, a first capacitor connected across the terminals of one of said ports and together with said gyrator circuit simulating an inductor having an inductance L and a dissipation loss, a second capacitor of capacitance C connected across the terminals of the other of said ports and together with said simulated inductor providing an LC resonant circuit, and a third capacitor connected in circuit with said gyrator circuit and having a value of capacitance sufficient to decrease the dissipation loss of said simulated inductor to a value equal to or less than zero thereby to allow the circuit to oscillate at a frequency determined by the LC product.

2. An oscillator circuit comprising, in combination:

a gyrator circuit having a two-terminal port and including first and second operational amplifiers each having first and second input terminals and an output terminal, a first resistor connected between the first input terminal of said first amplifier and one of the terminals of said two-terminal port, a second resistor connected between the first input terminal of said first amplifier and the output terminal thereof, a third resistor connected between the output terminal of said first amplifier and the first input terminal of said second amplifier, a fourth resistor connected between the output terminal of said second amplifier and the other terminal of said two-terminal port, and means directly connecting the second input terminals of said first and second amplifiers together and to said other terminal of said two-terminal port, a first capacitor connected between the first input terminal of said second amplifier and the output terminal thereof, said gyrator circuit and said first capacitor being operative to simulate an inductor having an inductance L and a dissipation loss, a second capacitor of capacitance C connected across the terminals of said two-terminal port and together with said simulated inductor providing an LC resonant circuit, and a third capacitor connected between the first input terminal of said second amplifier and said one terminal of said two-terminal port and having a value of capacitance sufficient to decrease the dissipation loss of said simulated inductor to a value equal to or less than zero thereby to allow the circuit to oscillate at a frequency determined by the LC product.

3. The oscillator circuit according to claim 2 wherein at least one of said resistors or one of said first or second capacitors is variable so as to provide tuning of the frequency of oscillation.

4. The oscillator circuit according to claim 2 further including an output terminal connected to the output terminal of said first amplifier, and a limiter circuit connected to said other terminal of said two-terminal port and operative to limit the peak-to-peak amplitude of the output oscillations.

No references cited.

JOHN KOMINSKI, Primary Examiner

U.S. Cl. X.R.

331—135; 333—80